United States Patent [19]
Hamada et al.

[11] Patent Number: 5,672,255
[45] Date of Patent: Sep. 30, 1997

[54] SPUTTERING DEVICE

[75] Inventors: Tsutomu Hamada; Takehito Hikichi, both of Ebina, Japan

[73] Assignee: Fuji Xerox Co., Ltd., Tokyo, Japan

[21] Appl. No.: 629,272

[22] Filed: Apr. 8, 1996

Related U.S. Application Data

[63] Continuation of Ser. No. 428,015, Apr. 25, 1995, abandoned.

[30] Foreign Application Priority Data

May 27, 1994 [JP] Japan ................. 6-115610

[51] Int. Cl.⁶ ................. C23C 14/34; C23C 14/56
[52] U.S. Cl. ................. 204/298.07; 204/298.11; 204/298.15; 204/298.23; 204/298.25
[58] Field of Search ............ 204/298.07, 298.11, 204/298.15, 298.23, 298.24, 298.25, 298.26, 298.27

[56] References Cited

U.S. PATENT DOCUMENTS

| | | | |
|---|---|---|---|
| 4,128,466 | 12/1978 | Harding et al. | 204/298.07 |
| 4,194,962 | 3/1980 | Chambers et al. | 204/298.23 |
| 4,421,622 | 12/1983 | Hollars | 204/298.07 |
| 4,975,168 | 12/1990 | Ohno et al. | 204/298.07 |
| 4,988,422 | 1/1991 | Wirz | 204/298.07 |
| 5,180,476 | 1/1993 | Ishibashi et al. | 204/298.25 |
| 5,228,968 | 7/1993 | Zejda | 204/298.07 |

FOREIGN PATENT DOCUMENTS 3-271369  12/1991  Japan ................. 204/298.07

OTHER PUBLICATIONS

ULVAC Technical Journal, Mar./1989, No. 31, pp. 9–13.

*Primary Examiner*—R. Bruce Breneman
*Assistant Examiner*—Rodney G. McDonald
*Attorney, Agent, or Firm*—Oliff & Berridge

[57] ABSTRACT

A sputtering device for coating a substrate which enters the device downstream and exits the device upstream. The device includes a vacuum container having a gas exhausting portion; a gas providing portion for providing inactive gas and reactive gas into the vacuum container upstream of the gas exhausting portion; a target provided in the vacuum container between a gas inlet and the gas exhausting portion; a diffusion interval from the target to the gas inlet, the diffusion interval having a length at least as great as the shortest distance between the target and the substrate to be coated; substrate supporting structure for supporting the substrate so that the substrate faces the target; and a plasma producing portion to produce gas plasma near the substrate. The reactive gas uniformly diffuses with the inactive gas within the diffusion interval, is made to be a plasma state, and reacts with sputtering particles scattered from the target to form a uniform film on a surface of the substrate.

10 Claims, 7 Drawing Sheets

SPUTTERING DEVICE

This is a continuation of application Ser. No. 08/428,015 filed Apr. 25,1995, now abandoned.

FIELD OF THE INVENTION

The present invention relates to a sputtering device, and especially to a sputtering device and methods for forming a thin layer on a large substrate.

BACKGROUND OF THE INVENTION

Figure 7:
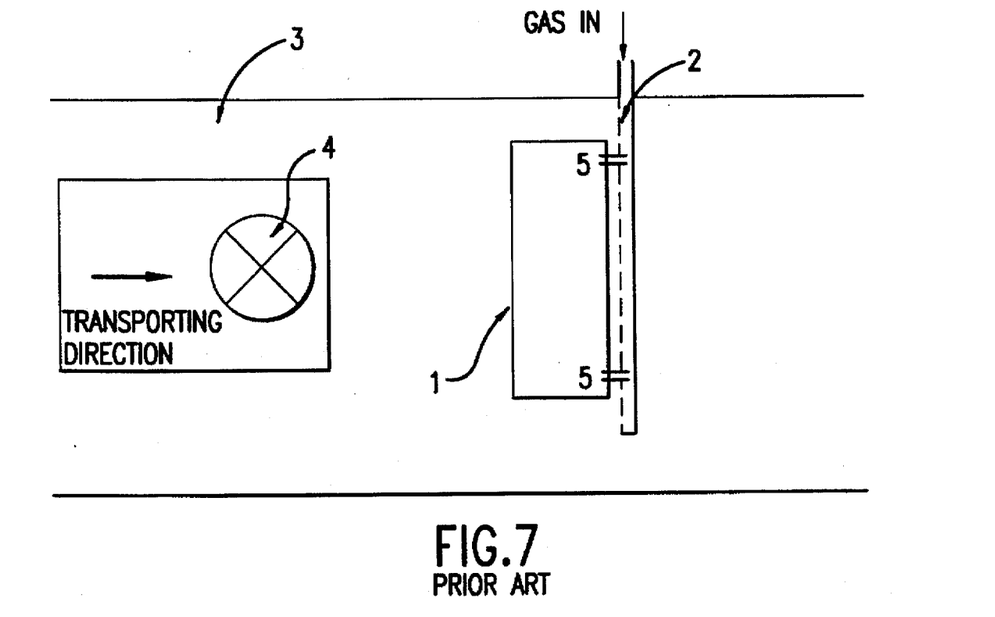
FIG. 7 shows an example of a conventional sputtering device seen from above.
Figure 8A:
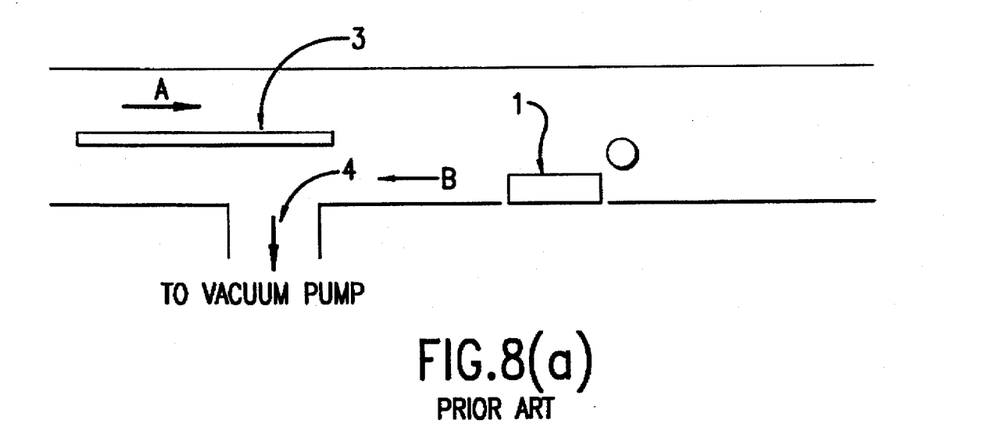
FIG. 8 is a cross-sectional view of an example of a conventional sputtering device.
Figure 8B:
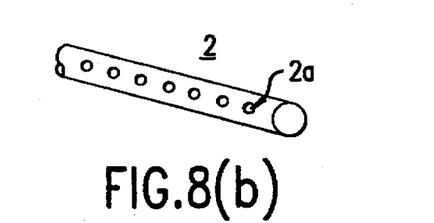

When making semiconductor devices such as image sensors on a large substrate, a magnetron sputtering device has been used as a sputtering device capable of forming films at high speed, and with this device, a film forming method with respect to transported substrates wherein a target, for example, a target having a width of 127 mm and a length of 502 mm is used and substrates are transported in the direction perpendicular to the length of the target and above the target is used. In this case, as shown by the view, seen from above, of FIG. 7 and the cross-sectional view of FIG. 8, argon gas which is used as the sputtering gas is provided from gas providing tube 2 provided near target 1 and having a plurality of small apertures (exits of gas providing portions) 2a along the direction of the length of the target (described in ULVAC TECHNICAL JOURNAL No. 31, 1989, pp. 9–13). The argon gas provided from gas providing tube 2 sputters target 1, causing sputtering particles, and a thin film is formed on substrate 3 by the accumulation of the sputtering particles. Here, as the substrate 3 is large, thin film formation is carried out while the substrate is transported above target 1. The gas is exhausted from gas exhausting portion 4 including a vacuum pump, and as the gas flowing direction B is opposite with respect to the direction A wherein the substrate is transported, even if unnecessary gas are transported into a reaction chamber with the substrate, they are exhausted from gas exhausting portion 4 before they reached to the target, and good thin film formation is carried out.

Figure 9:
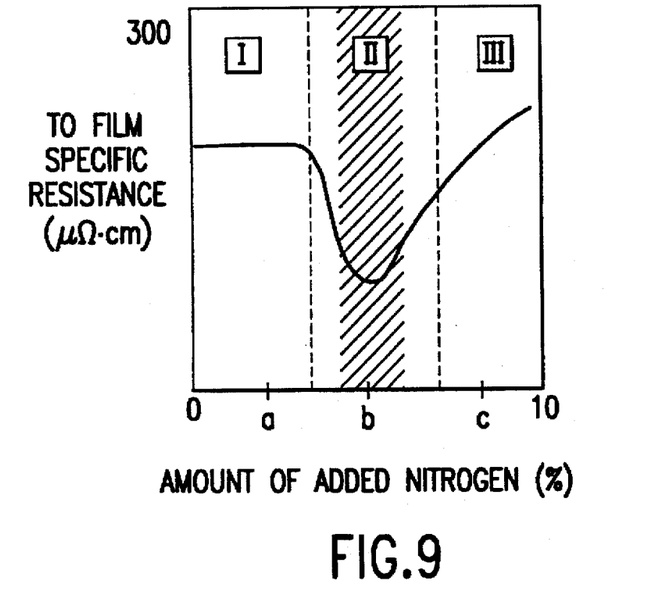
FIG. 9 shows the relation between the resistance value per thickness of a predetermined unit of a Ta film and the amount of added nitrogen.

However, when mixed gas wherein reactive gas such as oxygen or nitrogen is mixed with argon gas, which is used as sputtering gas, is provided from gas providing tube 2, there are problems wherein the amount of reactive gas included in sputtering gas differs in accordance with apertures where the gas is provided from and non-uniformity of the quality, place by place, of a formed film is caused. For example, when forming a film of Ta (tantalum) by sputtering, to reduce the electrical resistance of the Ta film, a method wherein sputtering is carried out using nitrogen gas added argon gas is used. As Ta crystal structure, there are α structure and β structure, and α structure has a low electrical resistance compared with β structure. Generally, when forming a Ta film by sputtering, the specific resistance depends on the amount of added nitrogen significantly. As shown by the relation between resistivity and amount of added nitrogen, which is shown in FIG. 9, when only argon gas is used as sputtering gas, the Ta crystal structure is β structure as shown in region I, and if the amount of added nitrogen is increased, the Ta crystal structure is α structure as shown in region II, and if the amount of added nitrogen is further increased, the Ta crystal structure is Ta nitride as shown in region III. As is known from this figure, the optimum amount of added nitrogen to obtain Ta of α structure having low electrical resistance is more or less some percent, though it is different device by device.

Figure 10A:
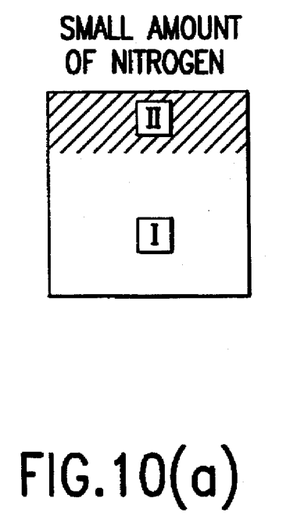
FIG. 10(a) shows the non-uniformity of the amount of added nitrogen in a film formed on a substrate in a case where the amount of added nitrogen is low.
Figure 10B:
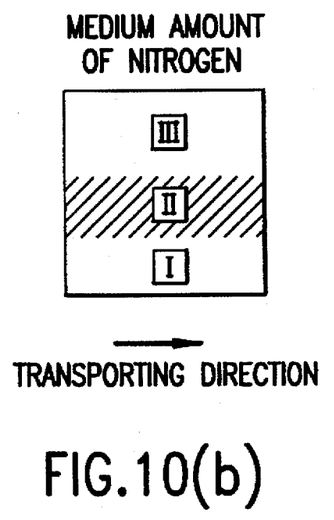
FIG. 10(b) shows the non-uniformity of the amount of added nitrogen in a film formed on a substrate in a case where the amount of added nitrogen is increased, compared with the case shown in FIG. 10(a).
Figure 10C:
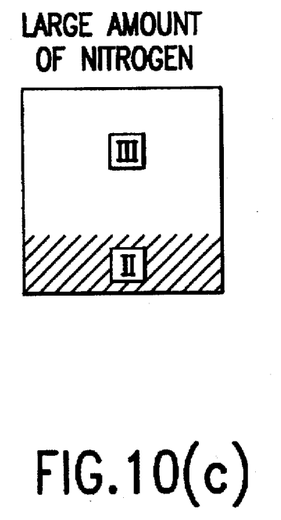
FIG. 10(c) shows the non-uniformity of the amount of added nitrogen in a film formed on a substrate in a case where the amount of added nitrogen is increased, compared with the case shown in FIG. 10(b).

When forming a film by the above described sputtering device, varying the amount of added nitrogen, non-uniformity of the amount of contained nitrogen in the layer is caused in the direction perpendicular to the direction wherein, substrates are transported, which leads to non-uniformity of the quality (difference of structure), place by place, of the layer. FIG. 10 shows the non-uniformity of the amount of nitrogen included in a layer of the cases where the amount of added nitrogen differs case by case when a Ta film is formed on a substrate having a width of 320 mm and a length of 340 mm under a sputtering pressure of 1.54 Pa (11.6 mTorr) and a sputtering power of 2.6 kW and with a substrate temperature of 150 ° C. As shown in FIG. 10(a), when the amount of added nitrogen is low, the further the portion is from the exit of gas providing tube 2, the more the amount of nitrogen is reduced, and here, the Ta crystal structure is α structure in region II and it is β structure in region I. Further, if the amount of added nitrogen is increased, as shown in FIG. 10 (b), the Ta crystal structure is $TaN_x$ in region III, α structure in region II, and it is β structure in the furthest portion from the exit of gas providing tube 2, that is, in region I. If the amount of added nitrogen is yet further increased as shown in FIG. 10(c), the Ta crystal structure is $TaN_x$ in region III and α structure in region II. Thus, even if the amount of added nitrogen is increased, non-uniformity of the quality of the film (difference of structure) is caused in the direction perpendicular to the direction wherein substrates are transported, and it is impossible to obtain a uniform film quality in the direction of the width of substrates.

A method wherein the amount of added gas is varied may be possible, but in this case, the amount of argon gas, which is used as sputtering gas, is also varied, by which the sputtering ability with respect to the target is varied.

With reactive sputtering wherein reactive gas is provided together with inactive gas used as sputtering gas, it is difficult to form a thin layer uniformly on a large substrate.

SUMMARY OF THE INVENTION

It is an object of the present invention to provide a sputtering device free of the defects found in the conventional art.

It is another object of the present invention to provide a sputtering device using reactive gas in addition to inactive gas and capable of forming thin layers uniformly on large substrates.

Additional objects and advantages of the invention will be set forth in part in the description which follows and in part will be apparent from the description, or may be learned by practice of the invention.

The sputtering device according to the present invention comprises:

- a gas providing portion providing inactive gas and reactive gas;
- a vacuum container having a gas exhausting portion;
- a target provided in the vacuum container;
- substrate supporting means for supporting substrates to be processed so that the substrates face the target; and
- a plasma producing portion for making the reactive gas provided by the gas providing portion to be plasma state and producing gas plasma near the substrates to be a processed, and
- an exit of the gas providing portion is provided in the side upstream of the gas exhausting portion with the target between them and a diffusion interval between the gas providing portion and the target, and
- the reactive gas provided by the exit of the gas providing portion is diffused with the inactive gas through the diffusion interval, uniformed in the direction along the length of the target and made to be plasma state, and the reactive gas reacts to sputtering particles scattered from the target, by which a thin film is formed on the surfaces of the substrates.

It is preferable that the substrate supporting means has transporting means for transporting substrates.

It is also preferable that the diffusion interval is equivalent to the distance between the target and the substrates to be processed or longer than that.

It is further preferable that the exit of the gas providing portion provides gas toward the opposite side with respect to the gas exhausting portion.

It is yet further preferable that the gas providing portion has an exit which provides gas toward the opposite side with respect to the gas exhausting portion and a diffusing plate provided facing the exit of the gas providing portion and for diffusing the provided gas.

According to the present invention, as the exit of the gas providing portion is provided in the side upstream of the gas exhausting portion with the target between them and with a diffusion interval between the gas providing portion and the target, the reactive gas provided from the exit of the gas providing portion is uniformed, while coming through the diffusion interval with inactive gas, being diffused, near the substrates to be processed (if a film is formed while the substrates are transported, they are uniformed in the direction along the length of the target), and the partial pressure of the reactive gas is uniformed near the target. The reactive gas reacts to sputtering particles which are scattered from the target by the sputtering of the inactive gas against the target, by which a uniform thin film is formed.

The degree of uniformity caused by diffusion is varied in accordance with the size of a reaction chamber, exhaustion amount of a vacuum pump, the shape of the gas exhausting exit and the distance between the exit of the gas providing portion and the gas exhausting exit. If the diffusion interval is more or less equivalent to the distance between the target and the substrates, the uniformity is obtained. Preferably, the interval is more or less 600 mm.

Further, as the exit of the gas providing portion provides gas toward the side opposite to the side wherein gas exhausting portion is provided, that is, the side opposite with respect to the target, the gas flows toward the gas exhausting portion not directly but being diffused, which improves the uniformness of formed films.

If the gas providing portion comprises an exit for providing the gas toward the side opposite with respect to the gas exhausting portion and a diffusing plate provided facing the exit of the gas providing portion and diffusing the provided gas, the provided gas reaches the target, being diffused well by the diffusing plate.

The sputtering device according to the present invention is applicable in a case where metal films or metal compound films are formed by using a metal of high melting point such as tantalum, titanium or molybdenum or a mixture for the material of the target and using nitrogen or oxygen of them for reactive gas, a case where semiconductor films are formed by using a semiconductor of indium oxide, tin oxide or silicon for a target and using nitrogen or oxygen for reactive gas or other cases.

BRIEF DESCRIPTION OF THE DRAWINGS

The manner by which the above objects and the other objects, features and advantages of the preset invention are attained will be fully evident from the following detailed description when it is considered in light of the accompanying drawings, wherein.

DETAILED DESCRIPTION OF THE INVENTION

Embodiments of the present invention is now described, referring to figures.

EMBODIMENT 1

Figure 1:
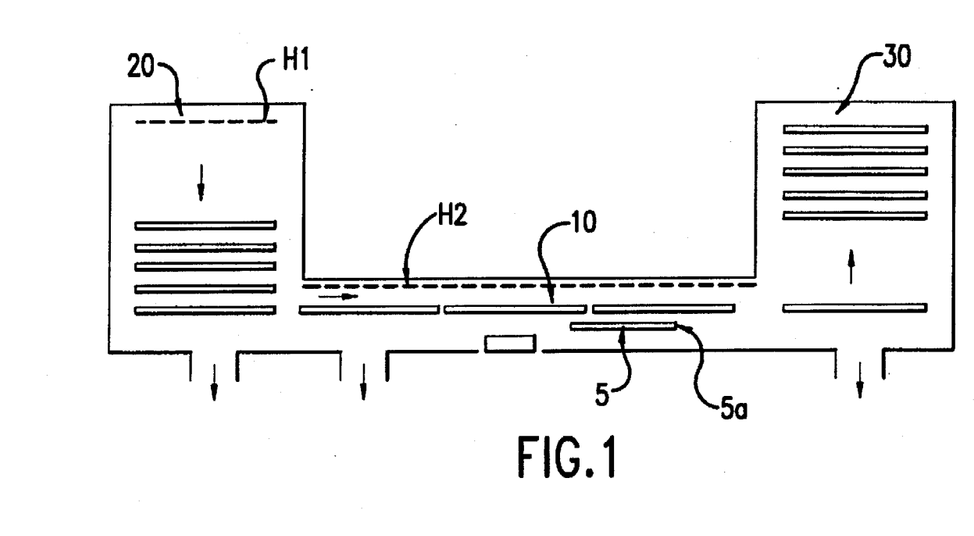
FIG. 1 is a schematic view of the sputtering device according to a first embodiment of the present invention.

FIG. 1 is a schematic view of the in-line system lateral sputtering device according to the first embodiment of the present invention.

Figure 2:
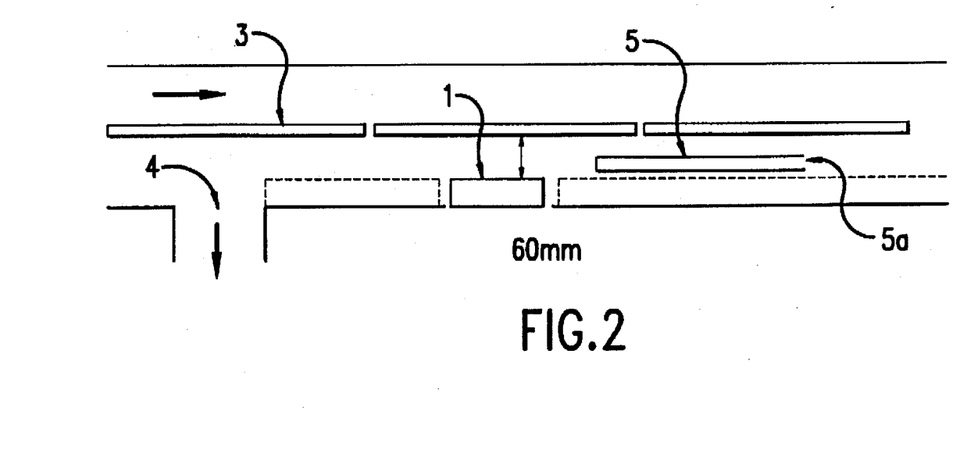
FIG. 2 shows the principal portion of the device shown in FIG. 1.

As shown in FIGS. 1 and 2, this sputtering device comprises:

reaction chamber 10 having a width of 1000 mm, a height of 500 mm and a length of 4000 mm;

loading chamber 20 connected to one side of reaction chamber 30; and unloading chamber 10 connected to the other side of reaction chamber 10.

At maximum 40 glass substrates, each of which has a width of 320 mm and a length of 340 mm, are stored in loading chamber 20, glass substrates 3 are transported to reaction chamber 10 one by one, and Ta films are formed on the substrates by reactive sputtering while they are transported in the reaction chamber. In reaction chamber 10, target 1 of tantalum having a width of 127 mm and a length of 508 mm is provided, gas providing portion 5 having (gas providing) exit 5a and which is apart from target 1 by 600 mm toward the direction of unloading chamber 30 is provided, and gas exhausting portion 4 provided between loading chamber 20 and target 1 are provided. Nitrogen gas provided from gas providing portion 5 as reactive gas together with argon gas provided as sputtering gas is made to be a plasma state by DC power supply, and the nitrogen gas reacts to sputtering particles scattered from the target in the direction along the length of the target, by which a thin Ta film is formed on the surfaces of glass substrates 3. Ar and $N_2$ are provided by 253 sccm and 7.5 sccm respectively, and the pressure in the reaction chamber is 1.54 Pa (11.6 mTorr). Other portions are structured in the same way as conventional devices wherein target 1 is attached to a backing plate (not shown in the figure) which also acts as a first electrode, a second electrode (not shown in the figure) which also acts as a substrate supporting and transporting portion for supporting and transporting glass substrates 3 is provided facing target 1, and DC voltage is applied between the first and second electrodes.

On the surface of target 1, a magnetic field φ which is parallel to the surface is formed by solenoid (not shown in the figure), and electrons in the plasma carries out cycloid motion which improves the ionization efficiency with respect to atoms and molecules in the gas by the mutual action, which is caused by the magnetic field, of the electric field and magnetic field, by which plasma of high density is allowed to occur under a condition of comparatively low pressure.

Lamp heaters H1 to heat glass substrates are provided in the loading chamber, and sheath heaters H2 are provided in the reaction chamber to keep the substrate temperature uniform.

A method wherein a thin Ta film is formed, using this device is now described.

Glass substrates which are to be processed are transported onto the second electrode of reaction chamber 10 by a loading mechanism and a transporting mechanism, and the substrates are fixed by electrostatic chucks (not shown in the figure).

After evacuating reaction chamber 10 for 30 minutes by gas exhausting portion 4, the temperature of the glass substrates is controlled to be a predetermined value (Here, 150° C.), Ar gas and $N_2$ gas are provided from the exit 5a of gas providing portion 5 in the direction opposite to the direction wherein the substrates are transported and electric power is applied between target 1 (the first electrode) and the second electrode. Here, as a target of a metal such as tantalum is sputtered, DC electric power is used. If a target of an insulating material is sputtered or covering steps of films formed on substrates is emphasized, high frequency is used. By applying electric power, plasma of argon gas is made, a cathode voltage drop Vdc is caused on the surface of target 1, which makes argon ions directed at the surface of target 1, and the target material is scattered in the plasma by the sputtering. Here, the electrons in the plasma carries out cycloid motion by the mutual action, which is caused by a magnetic field φ formed by solenoid, of the electric field and magnetic field, and the ionization efficiency with respect to atoms and molecules in the gas is improved, by which plasma of high density is allowed to occur under a condition of a comparatively low pressure of approximately 0.1 mTorr. Thus, accumulation speed is improved, and uniform thin films of high quality can be formed.

Figure 3A:
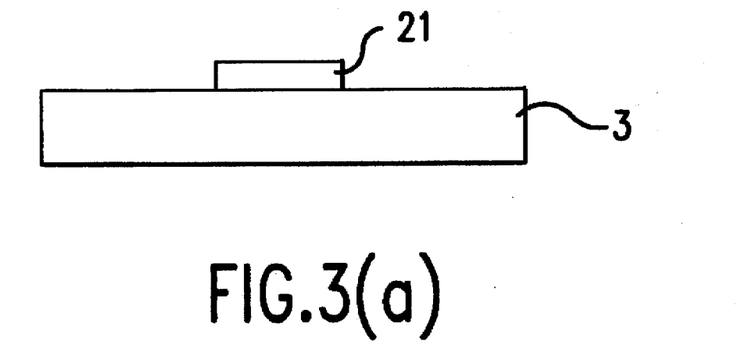
FIG. 3(a) shows a Ta film of low electric resistance formed on the surface of the glass substrate 3 by the accumulation of particles lead from the direction perpendicular to the glass substrate.

When the particles made by the reaction of sputtering particles and reactive gas are emitted in the plasma, they are charged by the plasma and become charged particles. These charged particles are diffused, moved in accordance with the electric field in the plasma, and they are made to progress in the direction perpendicular to glass substrates 3 on the second electrode by a parallel magnetic field formed by the solenoid coil. Moreover, the moving speed of the charged particles is increased by the bias voltage applied to the glass substrates, and the directionality may be further increased. Thus, Ta films of low electric resistance is formed on the surfaces of the glass substrates 3 by the accumulation of the particles lead from the direction perpendicular to the glass substrates as shown in FIG. 3(a).

Figure 3B:
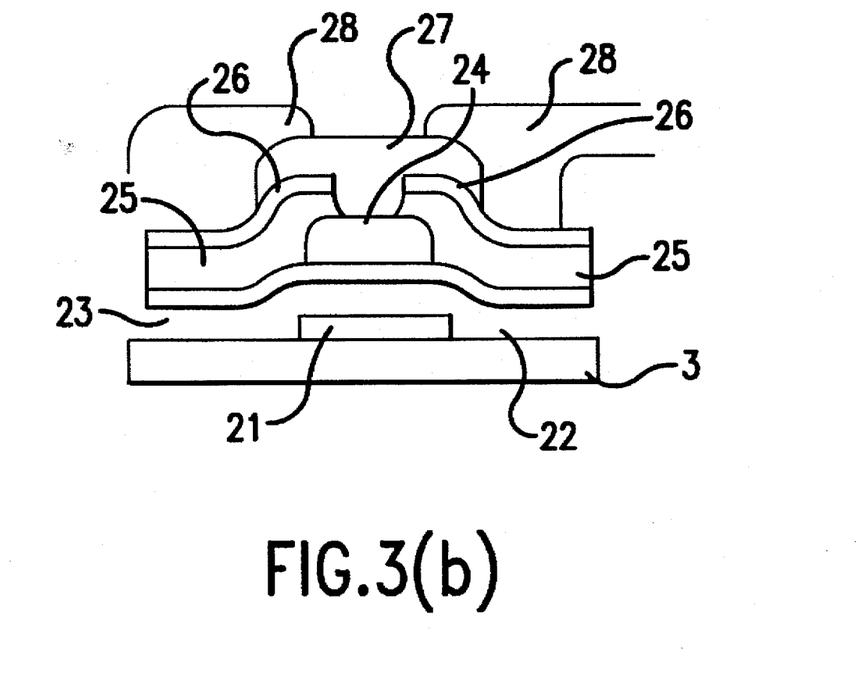
FIG. 3(b) shows a thin film transistor is made on the glass substrate.

After a Ta film having a thickness of 100 nm is formed, gate electrode 21 is made by shaping the film in accordance with a desired pattern by photolithography, and films are laminated, in this order: an amorphous silicon nitride film (a-SiN$_x$:H) having a thickness of 300 nm and formed as gate electrode insulating film 22 by CVD method; an amorphous silicon film (a-Si:H) having a thickness of 50 nm and formed as active layer 23; an amorphous silicon nitride film (a-SiN$_x$:H) having a thickness of 300 nm and formed as insulating film 24, and after laminating a photo-resist film on the amorphous silicon nitride film, insulating film 24 is shaped in accordance with a desired pattern by an exposure from the direction of the rear side of substrate 3, and an insulating film shaped in the same way as gate electrode 21 is formed. After this process, a thin film transistor is made on the glass substrate as shown in FIG. 3(b) by forming other films or making holes in the above described laminate, in this order: a n+amorphous silicon film (a-Si:H) having a thickness of 10 nm, which is source drain region 25; Ti layers 26 having a thickness of 150 nm as a barrier metal; crossover insulator 27; contact holes; and aluminum layers for signal line 28 having a thickness of 1.5 μm.

Thus made thin film transistor is reliable, that is, its characteristics are not easily changed.

Figure 4:
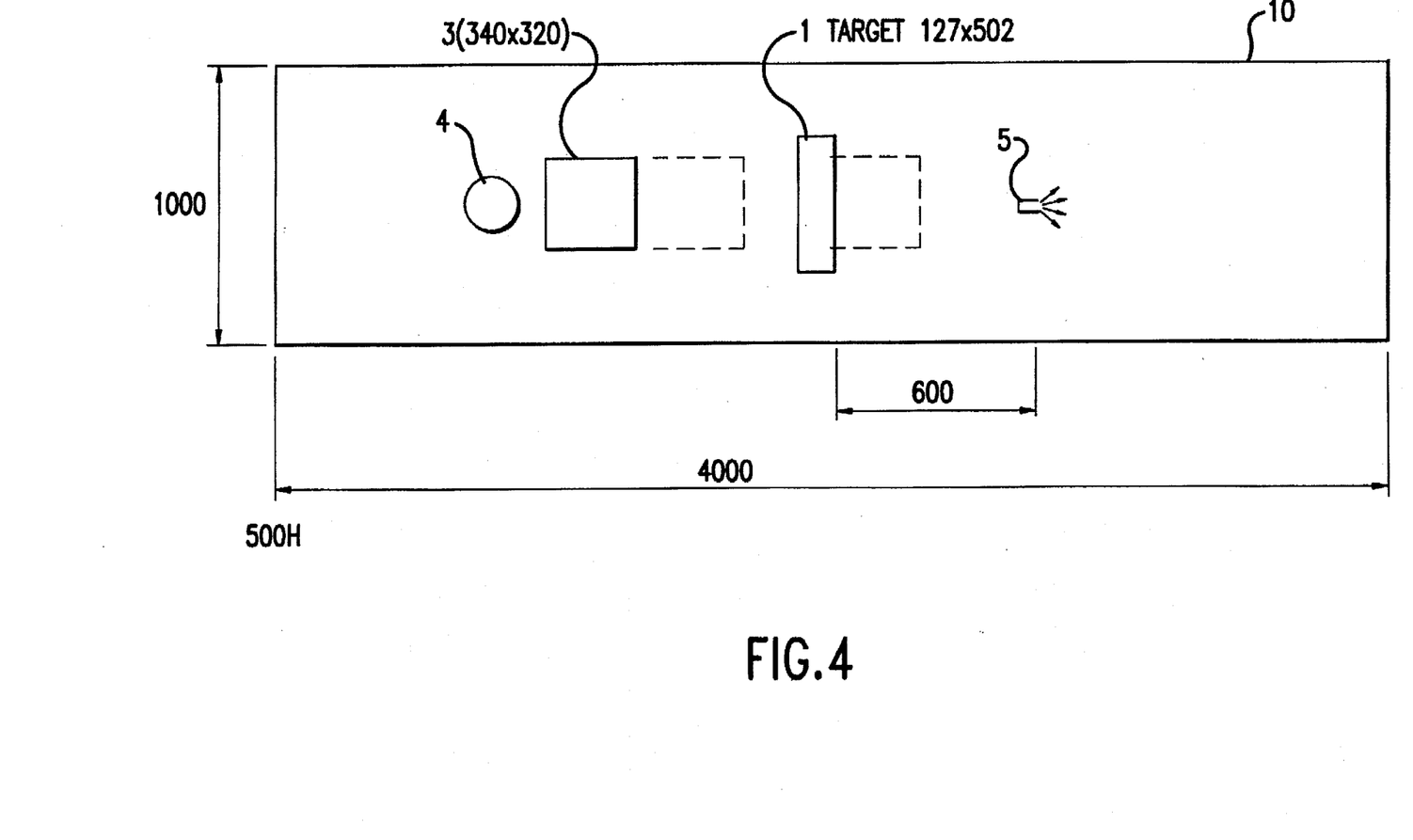
FIG. 4 shows a modified example of the sputtering device shown in FIG. 1.
Figure 5:
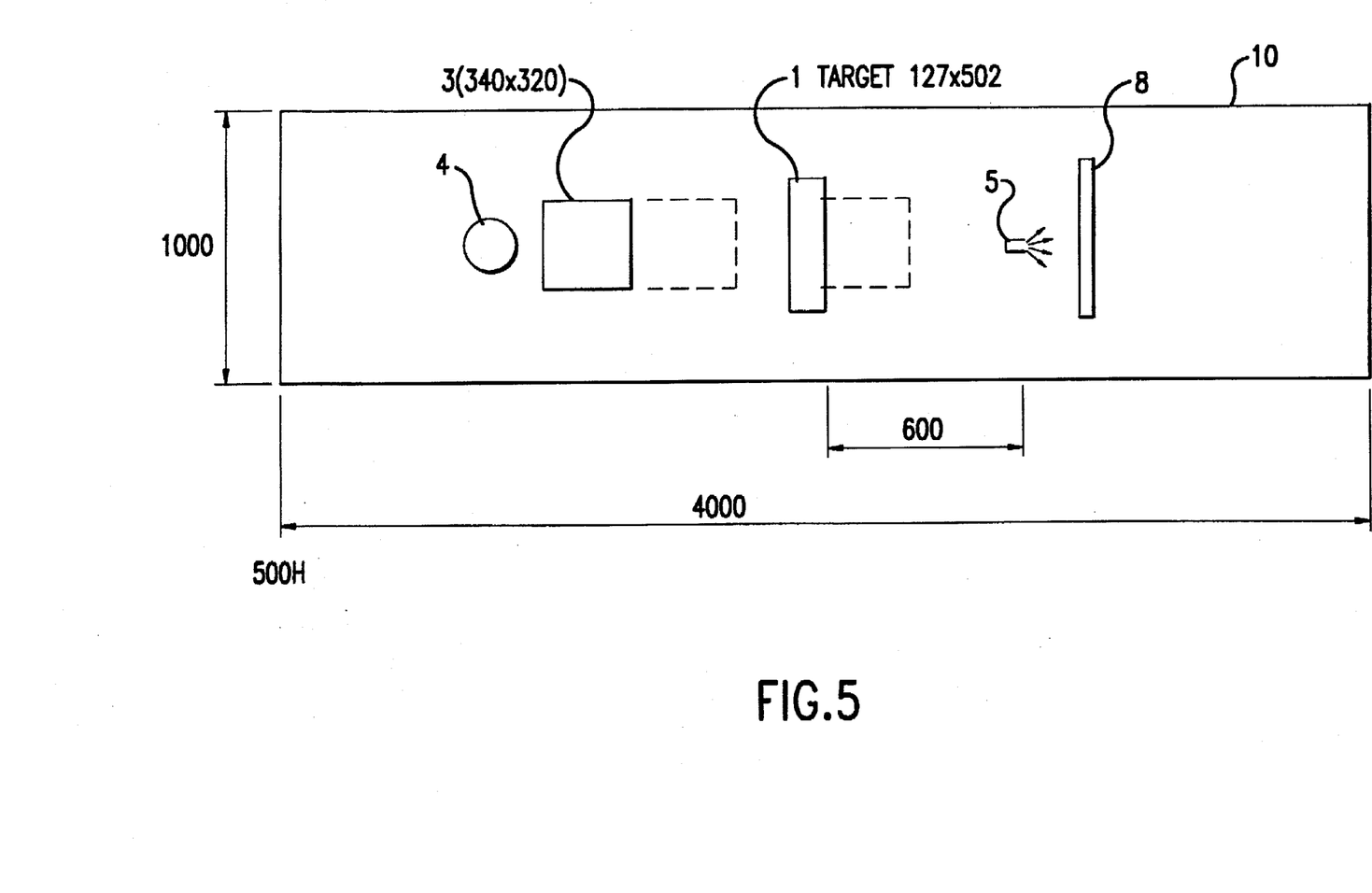
FIG. 5 shows another modified example of the sputtering device shown in FIG. 1.

In this embodiment, it is possible that the exit 5a of the gas providing portion emits gas toward the direction opposite to the target as shown in FIG. 4, and it is also possible to provide diffusion plate 8 in addition to the gas emission of the exit toward the direction opposite to the target as shown in FIG. 5.

EMBODIMENT 2

The second embodiment according to the present invention is now described.

Figure 6:
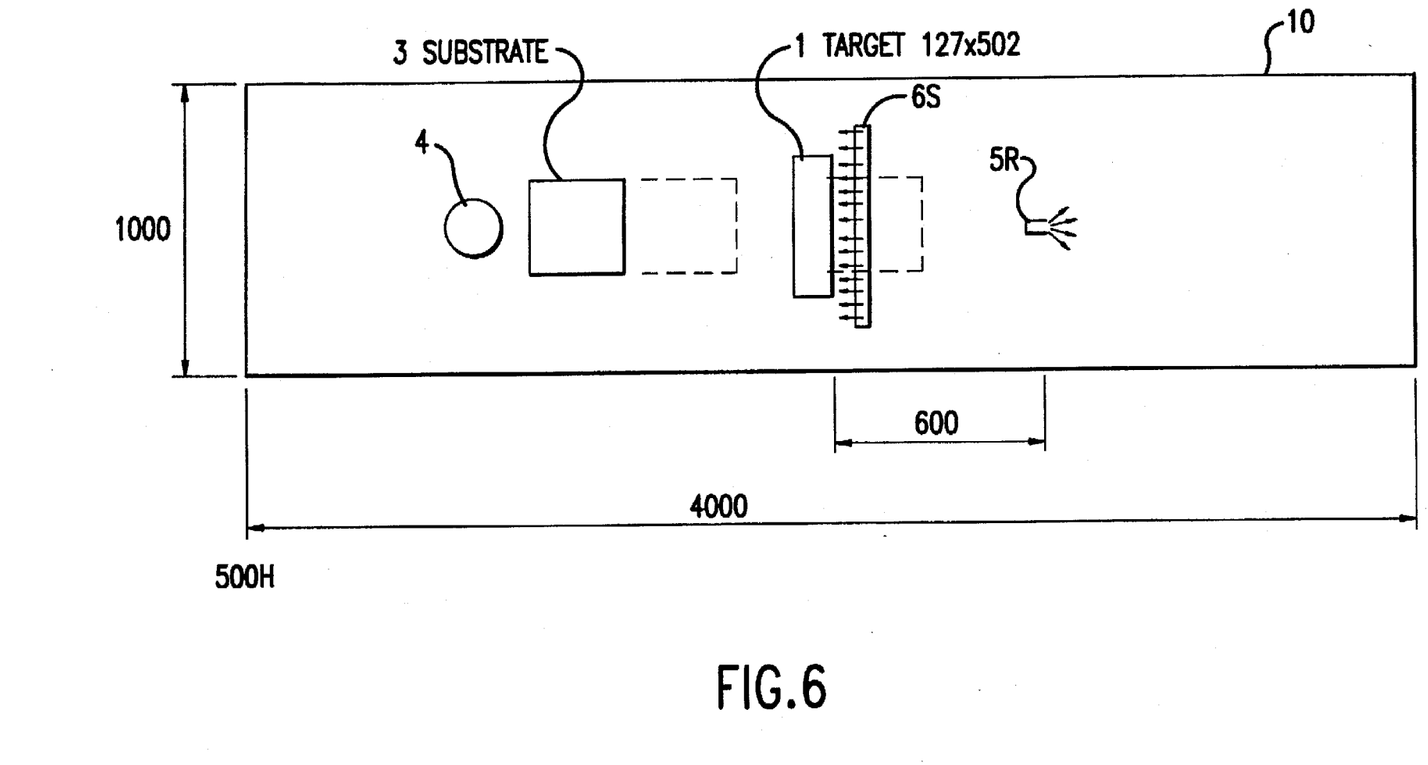
FIG. 6 shows the sputtering device according to a second embodiment of the present invention.

With a sputtering device according to this embodiment, as shown in FIG. 6, argon gas is provided from the exit for argon gas 5S provided near the target as an conventional example, and reactive gas is provided from the exit for reactive gas 5R provided apart from the target as the above described first embodiment.

Other portions are structured completely in the same way as embodiment 1.

Uniform thin layers can be formed by this embodiment.

In the first embodiment, a case where a thin Ta film is formed is described, and these sputtering devices are also applicable in forming high melting point thin films of titanium, tungsten, molybdenum or the like or various kinds of thin films such as an insulating film of silicon oxide or others and in a case where ITO is sputtered, using a target of indium tin and mixed gas of argon gas and oxygen gas.

In this specification, examples wherein thin films are formed are described, and this invention is also applicable in cases where etching by sputtering is carried out.

In addition, the structure and materials of a sputtering device are not restricted to those described in the above described embodiments, and they can be modified in the range satisfying the points of the present invention.

As described above, with the present invention, uniform thin films of good quality can be formed on large substrates.

What is claimed is:

1. A sputtering device for coating a mobile substrate entering said device downstream and exiting upstream of said device, comprising:

a vacuum container having a gas exhausting portion;

a gas providing portion for providing inactive gas and reactive gas by means of at least one first gas inlet into said vacuum container, said at least one first gas inlet being provided upstream of said gas exhausting portion and providing gas away from said gas exhausting portion;

a target provided in said vacuum container between said at least one first gas inlet and said gas exhausting portion;

a diffusion interval from said target to said at least one first gas inlet, said diffusion interval having a length at least as great as a shortest distance between said target and the mobile substrate;

substrate supporting means for supporting the mobile substrate so that the mobile substrate faces said target as the mobile substrate travels a length of said vacuum container; and a plasma producing portion to produce gas plasma near the mobile substrate, wherein said reactive gas uniformly diffuses with said inactive gas within said diffusion interval, is made to be in a plasma state and reacts with sputtering particles scattered from said target to form a uniform film on a surface of said mobile substrate.

2. The sputtering device described in claim 1, wherein said substrate supporting means has transporting means for transporting said substrate.

3. The sputtering device described in claim 1, further comprising a diffusing plate facing said at least one first gas inlet and located a distance from a vacuum container wall for diffusing said gas.

4. The sputtering device described in claim 1, further comprising at least one second gas inlet providing gas toward said gas exhausting portion.

5. The sputtering device described in claim 4, further comprising a diffusing plate facing said at least one first gas inlet.

6. The sputtering device described in claim 1, wherein said diffusion interval length is greater than the shortest distance between said target and said substrate.

7. A sputtering device for uniformly coating a surface of a mobile substrate which enters said device at a downstream position and exits said device at an upstream position, said device comprising:

a vacuum container having a gas exhausting portion and a gas providing portion, said gas exhausting portion located in said downstream position and said gas providing portion located in said upstream position, said gas providing portion comprising at least one first gas inlet which provides gas into said vacuum container away from said gas exhausting portion, and at least one second gas inlet which provides gas into said vacuum container towards said gas exhausting portion;

a target provided in said vacuum container between said at least one first gas inlet and said gas exhausting portion;

a diffusion interval from said target to said at least one first gas inlet, said diffusion interval having a length at least as great as a shortest distance between said target and said mobile substrate;

substrate transporting means for transporting the mobile substrate through a sputtering zone near said target; and a plasma producing portion to produce gas plasma near the mobile substrate.

8. The sputtering device described in claim 7, further comprising a diffusing plate facing said at least one first gas inlet and located a distance from a vacuum container wall for diffusing said gas.

9. A sputtering device for uniformly coating a surface of a mobile substrate which enters said device at a downstream end and exits said device at an upstream end, said device comprising:

a vacuum container having a gas exhausting portion and a gas providing portion, said gas exhausting portion located near said downstream end and said gas providing portion located near said upstream end, said gas providing portion comprising at least one first gas inlet, which provides gas into said vacuum container away from said gas exhausting portion;

a diffusing plate facing said at least one first gas inlet and located a distance from a vacuum container wall for diffusing said gas;

a target provided in said vacuum container between said at least one first gas inlet and said gas exhausting portion;

a diffusion interval from said target to said at least one first gas inlet, said diffusing interval having a length at least as great as a shortest distance between said target and said mobile substrate;

substrate transporting means for transporting the mobile substrate through a sputtering zone near said target; and a plasma producing portion to produce gas plasma near the mobile substrate.

10. The sputtering device described in claim 9, further comprising at least one second gas inlet, which provides gas into said vacuum container towards said gas exhausting portion.

* * * * *